US011973320B2

(12) United States Patent
Gerlach

(10) Patent No.: US 11,973,320 B2
(45) Date of Patent: Apr. 30, 2024

(54) VCSEL DEVICE FOR AN SMI SENSOR FOR RECORDING THREE-DIMENSIONAL PICTURES

(71) Applicant: TRUMPF Photonic Components GmbH, Ulm (DE)

(72) Inventor: Philipp Henning Gerlach, Ulm (DE)

(*) Notice: Subject to any disclaimer, the term of this patent is extended or adjusted under 35 U.S.C. 154(b) by 647 days.

(21) Appl. No.: 17/124,513

(22) Filed: Dec. 17, 2020

(65) Prior Publication Data
US 2021/0104873 A1  Apr. 8, 2021

Related U.S. Application Data

(63) Continuation of application No. PCT/EP2019/065872, filed on Jun. 17, 2019.

(30) Foreign Application Priority Data

Jun. 26, 2018  (EP) .................................... 18179866

(51) Int. Cl.
*H01S 5/42* (2006.01)
*G01B 9/02* (2022.01)
(Continued)

(52) U.S. Cl.
CPC .......... *H01S 5/423* (2013.01); *G01B 9/02092* (2013.01); *H01S 5/0234* (2021.01); *H01S 5/18305* (2013.01)

(58) Field of Classification Search
CPC .... H01S 5/423; H01S 5/0234; H01S 5/18305; H01S 5/18361; H01S 5/18388; H01S 5/0264; H01S 5/0028; G01B 9/02092
(Continued)

(56) References Cited

U.S. PATENT DOCUMENTS 5,914,976 A  *  6/1999  Jayaraman ............ H01S 5/0262
                                                    372/50.21
6,023,485 A  *  2/2000  Claisse ............... H01S 5/18308
                                                    372/50.11
(Continued)

FOREIGN PATENT DOCUMENTS

CN          103178442 A      6/2013
JP           07335976 A     12/1995
(Continued)

OTHER PUBLICATIONS

Guido Giuliani et al., "Laser diode self-mixing technique for sensing applications," Journal of Optics A: Pure and Applied Optics, Nov. 2002, pp. 283-294, IOP Publishing, Bristol, United Kingdom.

Primary Examiner — Vu A Vu
(74) Attorney, Agent, or Firm — Leydig, Voit & Mayer, Ltd.

(57) ABSTRACT

A Vertical Cavity Surface Emitting Laser (VCSEL) includes a VCSEL array, a multitude of detectors, a first electrical laser contact, and at least one second electrical laser contact. The VCSEL array comprises a multitude of laser diodes, each laser diode including an optical resonator having a first distributed Bragg reflector, a second distributed Bragg reflector and an active layer for light emission, the active layer being arranged between the first distributed Bragg reflector and the second distributed Bragg reflector. The first electrical laser contact and the at least one second electrical laser contact are arranged to provide an electrical drive current to electrically pump the optical resonators of the laser diodes. Each detector is arranged to generate an electrical self-mixing interference measurement signal associated to at least one laser diode upon reception of the laser light.

15 Claims, 7 Drawing Sheets

(51) Int. Cl.
*H01S 5/0234* (2021.01)
*H01S 5/183* (2006.01)

(58) Field of Classification Search
USPC .................................................. 372/50.21
See application file for complete search history.

(56) References Cited

U.S. PATENT DOCUMENTS

| | | | |
|---|---|---|---|
| 7,012,943 B2 * | 3/2006 | Tran | H01S 5/0264 |
| | | | 372/39 |
| 7,289,547 B2 * | 10/2007 | Trezza | H01S 5/18305 |
| | | | 372/50.1 |
| 8,467,428 B2 * | 6/2013 | Gerlach | H01S 5/18347 |
| | | | 372/50.21 |
| 8,692,979 B2 * | 4/2014 | Moench | G01P 3/366 |
| | | | 356/3 |
| 2003/0021327 A1 | 1/2003 | Murry | |
| 2011/0064110 A1 | 3/2011 | Gerlach et al. | |
| 2013/0163626 A1 | 6/2013 | Seurin et al. | |
| 2015/0362585 A1 | 12/2015 | Ghosh et al. | |
| 2016/0072258 A1 | 3/2016 | Seurin et al. | |
| 2016/0266242 A1 | 9/2016 | Gilliland et al. | |

FOREIGN PATENT DOCUMENTS

| | | |
|---|---|---|
| JP | 2007105140 A | 4/2007 |
| WO | WO 0237410 A1 | 5/2002 |
| WO | WO 2017016888 A1 | 2/2017 |
| WO | WO 2017198699 A1 | 11/2017 |

\* cited by examiner

VCSEL DEVICE FOR AN SMI SENSOR FOR RECORDING THREE-DIMENSIONAL PICTURES

CROSS-REFERENCE TO PRIOR APPLICATIONS

This application is a continuation of International Patent Application No. PCT/EP2019/065872, filed on Jun. 17, 2019, which claims priority to European Patent Application No. EP 18179866.1, filed on Jun. 26, 2018. The entire disclosure of both applications is hereby incorporated by reference herein.

FIELD

The invention relates to a Vertical Cavity Surface Emitting Laser (VCSEL) device for a self-mixing interference (SMI) sensor for recording three-dimensional (3D) pictures, the SMI sensor and a mobile communication device comprising the VCSEL device or the SMI sensor. The invention further relates to a corresponding method of fabricating such a VCSEL device.

BACKGROUND

State of the art optical 3D sensors need high power light sources and corresponding detectors. Optical alignment complexity, power consumption and eye safety are critical points.

WO 2017/016888 A1 discloses a laser sensor module for particle density detection. The laser sensor module may comprise an array of a multitude of laser diodes.

US 2011/0064110 A1 discloses a vertical cavity surface emitting laser device with a monolithically integrated photodiode.

US 2003/0021327 A1 discloses a vertical cavity surface emitting laser device comprising a photodetector deposited directly onto a top surface of the laser structure.

SUMMARY

The present disclosure provides an improved VCSEL device for an SMI sensor for recording three-dimensional pictures.

In an embodiment, the present invention provides a Vertical Cavity Surface Emitting Laser (VCSEL) device for a self-mixing interference sensor for recording three-dimensional pictures. The VCSEL device includes a VCSEL array, a multitude of detectors, a first electrical laser contact, and at least one second electrical laser contact. The VCSEL array comprises a multitude of laser diodes, each laser diode including an optical resonator having a first distributed Bragg reflector, a second distributed Bragg reflector and an active layer for light emission, the active layer being arranged between the first distributed Bragg reflector and the second distributed Bragg reflector. The first electrical laser contact and the at least one second electrical laser contact are arranged to provide an electrical drive current to electrically pump the optical resonators of the laser diodes. The first electrical laser contact is a common contact for all laser diodes of the VCSEL array. The at least one second electrical laser contact is arranged to electrically contact at least a subgroup of the multitude of laser diodes of the VCSEL array. Each detector is arranged to generate an electrical self-mixing interference measurement signal associated to at least one laser diode upon reception of the laser light.

According to a first aspect a Vertical Cavity Surface Emitting Laser (VCSEL) device for a self-mixing interference sensor for recording three-dimensional pictures is provided. The VCSEL device comprises a VCSEL array, a multitude of detectors (e.g. optical detector like photodiodes or photo transistors), a first electrical laser contact and at least one second electrical laser contact. The VCSEL array comprises a multitude of laser diodes (VCSEL). The multitude of laser diodes may be arranged on a common substrate. The common substrate may, for example, be a growth substrate for growing semiconductor layers the VCSEL array consists of or a substrate which is bonded to the VCSEL array in a subsequent processing step. Each laser diode comprises an optical resonator. The optical resonator comprises a first distributed Bragg reflector, a second distributed Bragg reflector and an active layer for light emission. The active layer is arranged between the first distributed Bragg reflector and the second distributed Bragg reflector. The first electrical laser contact and the at least one second electrical laser contact are arranged to provide an electrical drive current to electrically pump the optical resonators of the laser diodes. The first electrical laser contact is a common contact for all laser diodes of the VCSEL array. The at least one second electrical laser contact is arranged to electrically contact at least a subgroup of the multitude of laser diodes of the VCSEL array. Each detector may be arranged to receive laser light from at least one laser diode of the VCSEL array (optical detector). Each detector is arranged to generate a self-mixing interference measurement signal associated to the at least one laser diode upon reception of the laser light (optical detector, electrical detector etc.). Each detector may be associated to one, two, three, four or more laser diodes. A subgroup of the multitude of laser diodes of the VCSEL array may comprise, for example, a column or a row of the VCSEL array. A self-mixing interference signal is generated if a laser diode (VCSEL) emits laser light and a part of the emitted laser light is reflected back to the optical resonator of the respective laser diode. The reflected laser light interferes with the standing wave pattern within the optical resonator or laser cavity resulting in the self-mixing interference signal. The self-mixing interference signal can be detected by means of the detector (e.g. variations of the laser intensity within the optical resonator which can, for example, be detected by means of a photodiode).

The multitude of laser diodes may comprise more than 100 laser diodes. The multitude of laser diodes may especially comprise at least 1000, preferably at least 5000 and most preferably at least 10000 laser diodes. The VCSEL array may even comprise more than 100000 laser diodes (e.g. VGA resolution of 640×480 pixel and the like).

The VCSEL device may comprise two, three, four or more second electrical laser contacts. Each second electrical laser contact is in this embodiment arranged to electrically drive a corresponding subgroup of laser diodes of the VCSEL array. The second electrical laser contacts may, for example, be an anode laser contacts. A first anode contact may in combination with the first electrical laser contact (common cathode contact) provide an electrical drive current to a first column or row of the VCSEL array. The anode contacts may therefore enable switching on or off the respective subgroup independent from the other subgroups. The detectors may, for example, be arranged in a complementary arrangement with respect to the arrangement of the subgroup of the VCSEL array. The detectors may, for example, be arranged in rows if the laser diodes of the VCSEL array are arranged in columns. This matrix arrangement enables read out of a single self-mixing interference measurement corresponding to one laser diode signal by means of one detector even if one complete column of laser diodes emits laser light and generates a corresponding self-mixing interference signal within each optical resonator. The matrix arrangement simplifies contacting of the detectors but requires a corresponding switching scheme. An alternative approach is to provide one dedicated detector for each laser diode such that it is clear which laser diode generated the respective self-mixing interference measurement signal.

The VCSEL device may according to an alternative embodiment comprise one second electrical laser contact, wherein the first electrical laser contact and the second electrical laser contact are arranged to provide a common electrical drive current to all laser diodes of the VCSEL array. Each detector is in this embodiment associated to one dedicated laser diode to enable identification of the respective self-mixing interference measurement signal. This embodiment may enable a very fast measurement of a 3-D setting or scene.

The detector may be integrated in the optical resonator. The detectors may, for example, be integrated in the first distributed Bragg reflector or the second distributed Bragg reflector. The detectors may, for example, be integrated in an unstructured DBR such that one common detector may be arranged to receive self-mixing interference signals from two, three, four or more VCSELs as described above. The detector may, for example, be integrated in the first (lower) DBR to provide a common detector for neighboring VCSELs.

Each optical resonator may comprise one dedicated detector. Assignment between laser diode and corresponding dedicated detector is in this case unambiguous such that identification of the self-mixing interference signal is simplified.

Each detector may comprise a first detector electrode. The first detector electrode and at least one additional electrode are arranged to read out the electrical self-mixing interference measurement signal. The additional electrode may be comprised by the first electrical laser contact or the second electrical laser contact. The respective laser diode and detector share in this case one electrode or contact. The additional electrode may alternatively be a separate second detector electrode independent from the first electrical laser contact and the second electrical laser contact.

The at least one additional electrode may be the at least one second electrical laser contact(s). The detector is integrated in the second distributed Bragg reflector. The VCSEL array is arranged such that the laser light is emitted via the first distributed Bragg reflector during operation of the VCSEL device. The laser diodes (VCSELs) are in this case so-called bottom emitters which emit the laser light through the substrate if the substrate is not removed in a direction opposite to the side of the substrate next to the optical resonators. The emission wavelength is in this case such that the (GaAs) substrate is transparent (emission wavelength greater than 900 nm in case of GaAs) for example 940 nm. The substrate may alternatively be at least locally removed. The first detector electrodes of the detectors may be contacted by wire bonds. The self-mixing interference measurement signal can be read from each individual detector (e.g. photodiode or photo transistor).

The VCSEL device may alternatively be arranged as a flip chip device. The topmost first detector electrodes may (e.g. completely) cover the mesa of the respective laser diode (VCSEL). The first detector electrodes are (e.g. full) metal contacts that can be flip chipped. The second electrical laser contact(s) of the subgroup(s) (e.g. whole laser array, columns or rows) may, for example, be electrically contacted by means of wire bonds so that each detector (Pixel) can be read by a simple electrical connection. All of the laser diodes (VCSELs) may be operated simultaneously or subgroup by subgroup.

The VCSEL array may according to an alternative embodiment be mounted on a detector chip. The detector chip comprises the detectors. The detector chip may, for example, be a silicon-based detector chip comprising an array of photodetectors, wherein each photodetector is aligned with a corresponding laser diode (VCSEL) comprised by the VCSEL array. The detector chip may alternatively comprise, for example, rows or columns of photodetectors which may be arranged in a matrix arrangement with respect to the subgroups of laser diodes as discussed above.

The VCSEL device comprises at least one optical device arranged to redirect the laser light. The optical device may, for example, comprise a lens, an array of lenses, a diffusor or the like to spread the laser light emitted by the VCSEL array in a defined field-of-view. The at least one optical device may be an optical structure etched in a substrate (e.g. gallium arsenide growth substrate) comprised by the VCSEL array.

According to a further aspect a self-mixing interference sensor for recording three-dimensional pictures comprising a VCSEL device according to any embodiment discussed above is provided. The three-dimensional self-mixing interference sensor further comprises a driving circuit and an evaluator. The driving circuit is arranged to electrically drive the laser diodes by means of the first electrical laser contact and the at least one second electrical laser contact. The evaluator is arranged to evaluate the electrical self-mixing interference measurement signals. The evaluator may, for example, be arranged to determine distances, velocities and/or acceleration of objects based on self-mixing interference signals in each optical resonator or laser cavity of the laser devices comprised by the VCSEL array. The evaluator may further be arranged to reconstruct a three-dimensional picture of the field of view and objects in the field of view based on the multitude of distances, velocities and/or accelerations.

According to a further aspect a mobile communication device may comprise a VCSEL device according to any embodiment described above or a three-dimensional self-mixing interference sensor as described above. The mobile communication device is arranged to present a three-dimensional picture of a scene to a user of the mobile communication device based on self-mixing interference measurement signals of the scene as described above. The evaluation of the self-mixing interference measurement signals may be performed by the laser sensor and/or the mobile communication device. The VCSEL device or the three-dimensional self-mixing interference sensor may further be comprised by 3-D cameras.

According to a further aspect a method of fabricating a Vertical Cavity Surface Emitting Laser (VCSEL) device for a self-mixing interference sensor for recording three-dimensional pictures is provided. The method comprising the steps of: providing a substrate, providing a VCSEL array comprising a multitude of laser diodes on the substrate, wherein each laser diode comprises an optical resonator, wherein the optical resonator comprises a first distributed Bragg reflector, a second distributed Bragg reflector and an active layer for light emission, wherein the active layer is arranged between the first distributed Bragg reflector and the second distributed Bragg reflector, providing a first electrical laser contact, wherein the first electrical laser contact is a common contact for all laser diodes of the VCSEL array, providing at least one second electrical laser contact, wherein the first electrical laser contact and the at least one second electrical laser contact are arranged to provide an electrical drive current to electrically pump the optical resonators of the laser diodes, and wherein the at least one second electrical laser contact is arranged to electrically contact at least a subgroup of the multitude of laser diodes of the VCSEL array, and providing detectors, wherein each detector is arranged to generate an electrical self-mixing interference measurement signal associated to the at least one laser diode upon reception of laser light.

The steps need not be performed in the order given above. The different layers may be deposited by epitaxial methods like MOCVD, MBE and the like. The substrate may be removed in a subsequent processing step.

It shall be understood that the VCSEL device according to any embodiment described above and the method of fabricating the VCSEL device have similar and/or identical embodiments.

Further advantageous embodiments are defined below.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

In the Figures, like numbers refer to like objects throughout. Objects in the Figures are not necessarily drawn to scale.

DETAILED DESCRIPTION

Various embodiments will now be described by way of the Figures.

Self-mixing interference is used for detecting movement of and distance to an object. Background information about self-mixing interference is described in "Laser diode self-mixing technique for sensing applications", Giuliani, G.; Norgia, M.; Donati, S. & Bosch, T., Laser diode self-mixing technique for sensing applications, Journal of Optics A: Pure and Applied Optics, 2002, 4, S. 283-S. 294 which is incorporated by reference. Detection of movement of a fingertip relative to a sensor in an optical input device is described in detail in International Patent Application No. WO 02/37410 which is incorporated by reference. The principle of self-mixing interference is discussed based on the examples presented in International Patent Application No. WO 02/37410. A diode laser having a laser cavity or optical resonator is provided for emitting a laser or measuring beam. At its upper side, the device is provided with a transparent window across which an object, for example a human finger, is moved. A lens is arranged between the diode laser and the window. This lens focuses the laser beam at or near the window. If an object is present at this position, it scatters the measuring beam. A part of the radiation of the measuring beam is scattered in the direction of the illumination beam and this part is converged by the lens on the emitting surface of the laser diode and re-enters the cavity of this laser. The radiation re-entering the cavity of the diode laser induces a variation in the gain of the laser and thus in the intensity of radiation emitted by the laser, and it is this phenomenon which is termed the self-mixing effect in a diode laser.

The change in intensity of the radiation emitted by the laser or of the optical wave in the laser cavity can be detected by a photodiode or a detector arranged to determine an impedance variation across the laser cavity. The diode or impedance detector converts the radiation variation into an electric signal, and electronic circuitry is provided for processing this electric signal.

Figure 1:
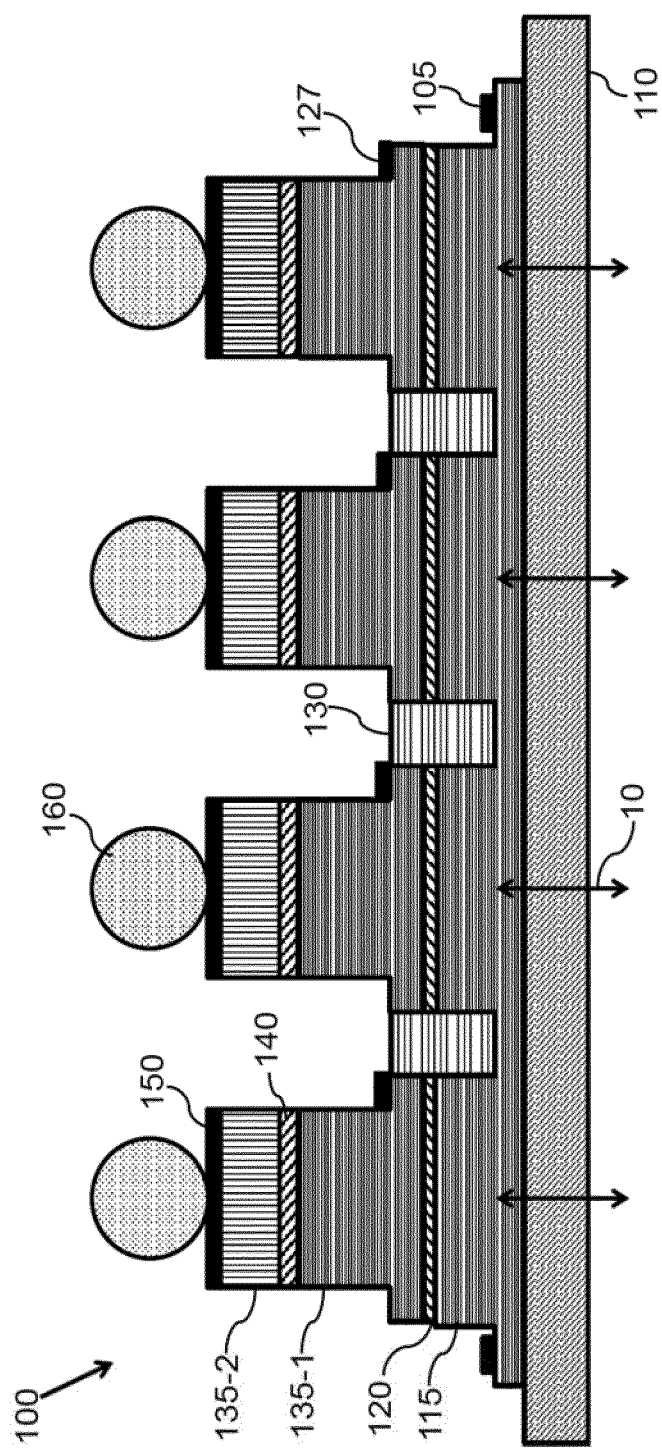
FIG. 1 shows a principal sketch of a cross-section of a first VCSEL device with integrated detectors.

FIG. 1 shows a principal sketch of a first VCSEL device 100 with integrated photodiode. The first VCSEL device 100 comprises a multitude of VCSELs with integrated photodiode which are arranged on a common substrate 110. The first VCSEL device 100 is a bottom emitter emitting laser light (indicated by the arrow) through the substrate 110. Each of the VCSELs with integrated photodiode comprises a first DBR 115, an active layer 120, a first part of a second DBR 135-1, a second part of the second DBR 135-2 and a detector 140. The detector 140 comprises at least one layer which is arranged to detect a variation of the optical wave within the optical resonator or laser cavity built by the first DBR 115 and the second DBR 135-1, 135-2 and the semiconductor layers sandwiched between the first DBR 115 and the second DBR 135-1, 135-2. The single VCSELs are in this embodiment separated by means of an oxidation opening 130 or trench which is subsequently filled with an electrically isolating material. The oxidation opening 130 may, for example, be used to provide a current aperture (not shown) in the first DBR 115 or the second DBR 135-1, 135-2. The VCSELs are electrically contacted by means of a first electrical laser contact 105 and at least one second electrical laser contact 127. The first electrical laser contact 105 electrically contacts in this embodiment a common current distribution layer (not shown) which is integrated in the non-etched part of the first DBR 115 to provide the current to all VCSELs comprised by the VCSEL array. The first VCSEL device 100 comprises a multitude of second electrical laser contacts 127, wherein each second electrical laser contact 127 contacts one row of VCSELs comprised by the VCSEL array. The rows are arranged perpendicular with respect to the plane of FIG. 1. The first DBR 115 comprises 30 pairs of layers with alternating refractive index to provide a reflectivity of 98.5% such that the emission of laser light through the substrate 110 is enabled. The first DBR 115 may, for example, comprise AlGaAs ($Al_xGa_{(1-x)}As$) layers with different Al concentration (e.g. variation between 15% and 90%) to provide different refractive indices. The first part of the second DBR 135-1 may comprise 30 pairs of layers with alternating refractive index and the second part of the second DBR 135-2 may comprise another 20 pairs of layers with alternating refractive index to provide sufficient reflectivity. The second part of the second DBR 135-2 of each mesa of the VCSELs is covered by a first detector electrode 150 such that each detector 140 can be read out by means of the corresponding second electrical laser contact 127 and the corresponding first detector electrode 150. A solder bump 160 is provided on top of each first detector electrode 150 such that the first VCSEL device 100 can be mounted in a flip chip arrangement on top of, for example, a submount (not shown) which may comprise evaluations circuitry to evaluate measurement signals generated by means of the first VCSEL device 100.

Figure 2:
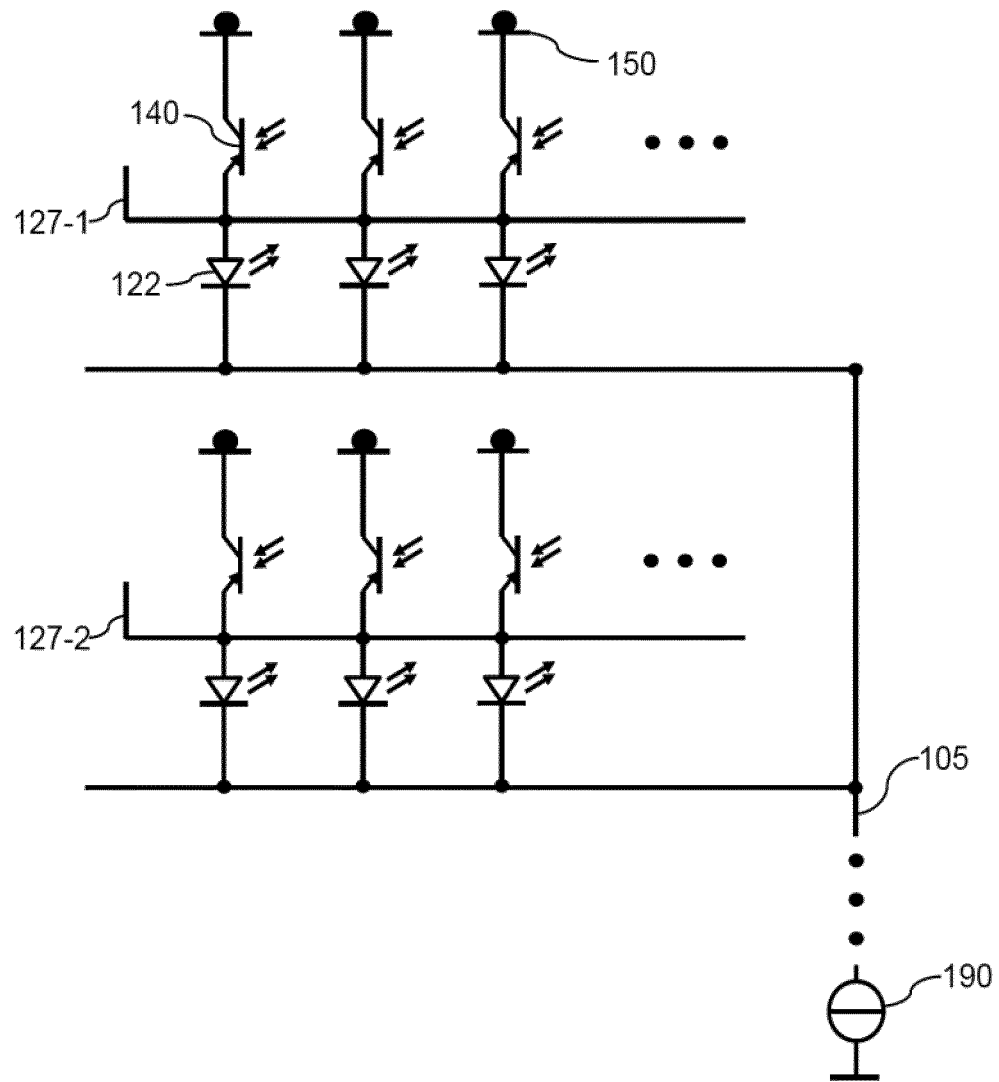
FIG. 2 shows a principal sketch of the electrical contacting scheme of the first VCSEL device.

FIG. 2 shows a principal sketch of the electrical contacting scheme of the first VCSEL device 100 shown in FIG. 1. The VCSELs are electrically pumped by means of a current source 190 which is contacted to the common first electrical laser contact 105 and to the second electrical laser contacts 127-1, 127-2 such that each row comprising a multitude of laser diodes 122 can be operated independent from the other rows. The second electrical laser contacts 127 and the first detector electrodes 150 are electrically connected with an evaluator (not shown) such that each detector 140 can be read out separately to determine the self-mixing measurement signals.

Figure 3:
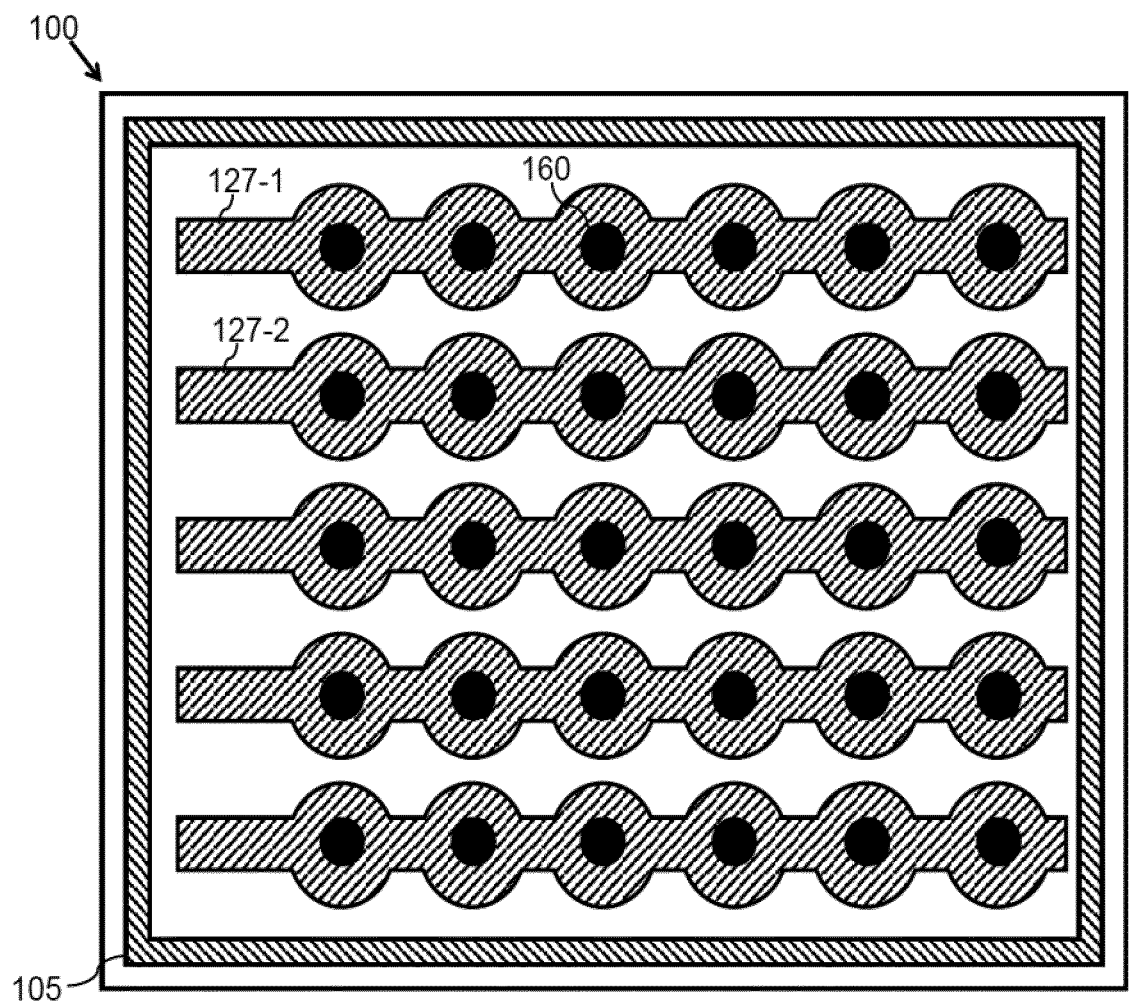
FIG. 3 shows a principal sketch of a top view of the first VCSEL device.

FIG. 3 shows a principal sketch of a top view of the first VCSEL device 100. The first VCSEL device 100 is electrically contacted by means of the common first electrical laser contact 105, the second electrical laser contacts 127-1, 127-2 . . . and the solder bumps 160.

Figure 4:
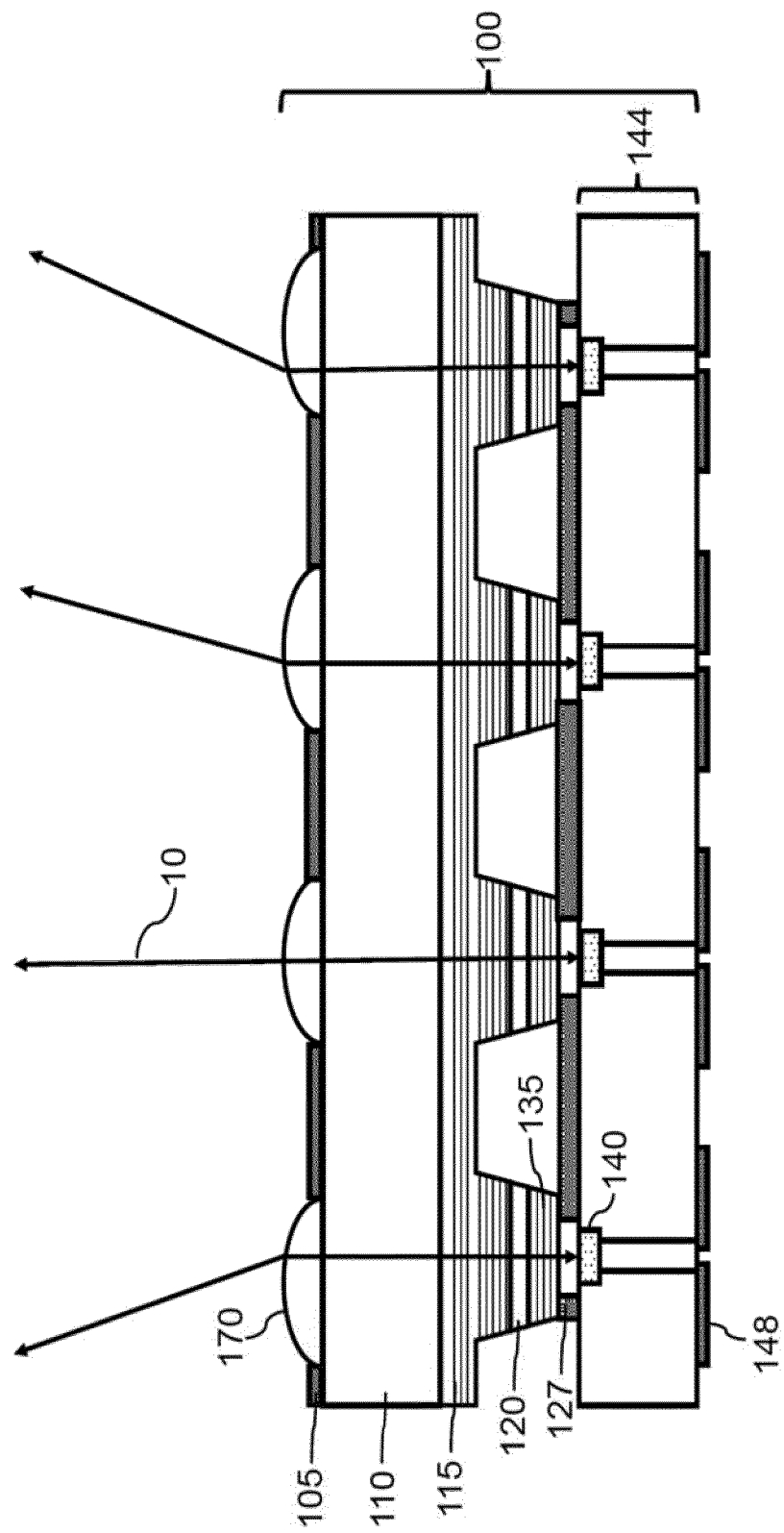
FIG. 4 shows a principal sketch of a second VCSEL device with detector chip.

FIG. 4 shows a principal sketch of a second VCSEL device 100 comprising a detector chip 144. The second VCSEL device 100 comprises in this embodiment a bottom emitting VCSEL array comprising an optical resonator with a first DBR, a second DBR 135 and an active layer 120 sandwiched between the first DBR 115 and the second DBR 135. The active layer 120 typically comprises one or several quantum well layers. A first electrical laser contact 105 (usually n-contact) is provided on a backside of the substrate 110 opposing the side of the substrate 110 on which the optical resonators are provided. An at least one second electrical laser contact 127 (usually p-contact) is provided on top of the second DBR 135. The first and the second electrical laser contacts 105, 127 are arranged to provide an electrical drive current (electrically pump) the optical resonator. The VCSEL device 100 may comprise further layers as, for example, current distribution layers, current confinement layers and the like which are not explicitly shown in FIG. 4 but well known to those skilled in the art. The first electrical laser contact 105 as well as the second electrical laser contact(s) 127 (both may comprise metal layers) may surround a hole through which laser light 10 can be emitted if a drive current above a laser threshold current of the VCSEL device 100 is supplied. Emission wavelength of the laser light 10 is above 900 nm, preferably above 930 nm such that the substrate 110 (GaAs) is essentially transparent for laser light 10. The VCSEL array of the VCSEL device 100 is mounted with the second electrode(s) 127 on a detector chip 144. The detector chip 144 is according to this embodiment arranged to provide electrical connection of the first electrical laser contact 105 and the second electrical laser contact (not shown). The detector chip 144 further comprises a multitude of detectors 140 (e.g. photodiodes). The detectors 140 are aligned with the openings of the first electrical laser contact 105 and the second electrical contact(s) 127. The reflectivity of the first DBR 115 and the second DBR 135 is arranged such that the laser light 10 is emitted through the substrate 110 and an optical device 170 (lens) which is etched in the substrate 110. The lenses are arranged to focus the laser light 10 to a field-of-view. The laser beams are spread with respect to each other by shifting the lenses with respect to a center of the corresponding VCSEL. The reflectivity of the second DBR 135 is such that a defined amount of laser light is received by the respective detector 140 to determine the self-mixing interference measurement signal. Each detector is electrically contacted to two contact pads 148 which are arranged on the opposite side of the detector chip 144. The contact pads 148 may enable mounting of the VCSEL device on, for example, a PCB.

Figure 5:
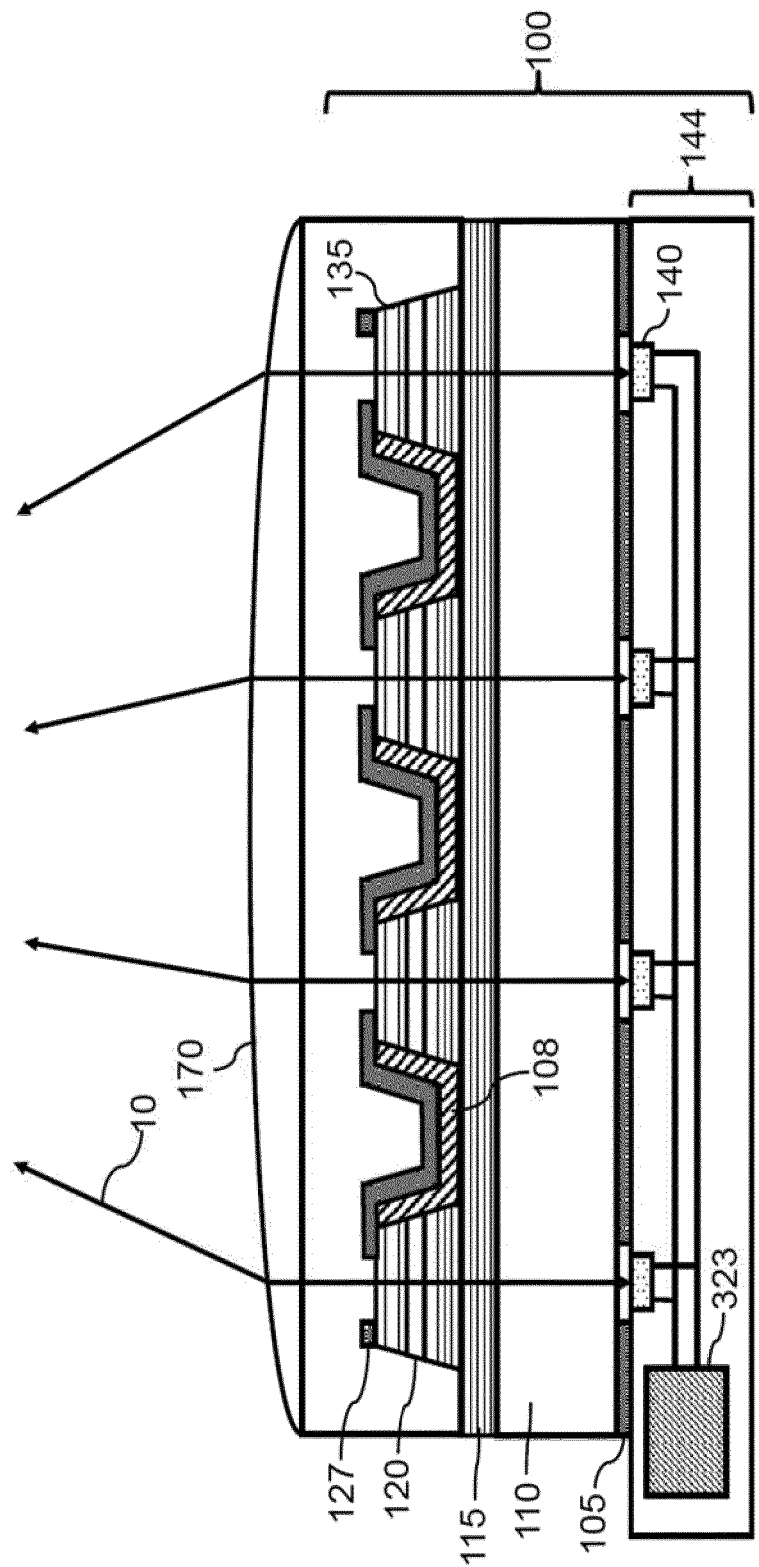
FIG. 5 shows a principal sketch of a third VCSEL device with detector chip.

FIG. 5 shows a principal sketch of a third VCSEL device 100 with detector chip 144. The third VCSEL device 100 comprises an array of top emitting VCSELs each comprising a first DBR 115, a second DBR 135 and an active layer 120 arranged between the first DBR 115 and the second DBR 135. Reflectivity of the second DBR 135 is in this case somewhat lower than the reflectivity of the first DBR 115. Majority of the laser light 10 is therefore emitted through e.g. ring shaped second electrical laser contacts 127 which are arranged on top of the second DBR 135 to electrically contact the rows or columns of VCSELs comprised by the VCSEL array similar as discussed with respect to FIG. 2 or 3. The second electrical laser contacts 127 are electrically isolated with respect to the first DBR 115 and the active layer 120 by means of an isolating structure 108 (e.g. oxide layer). A first electrical laser contact 105 is deposited on a backside of substrate 110 opposing the side of the substrate 110 on which the layer stacks of the first DBR 115 and subsequently the active layer 120, second DBR 135 and second electrical laser contact 127 are processed. The first electrical laser contact 105 comprises openings which are aligned with the VCSELs such that laser light 10 can be emitted via the substrate 110 through the corresponding opening. The substrate 110 may alternatively be locally removed to avoid absorption of laser light 10 by the substrate 110. The third VCSEL device 100 is similarly as discussed with respect to FIG. 4 mounted on the detector chip 144 which comprises an electrical driver (not shown) which is arranged to provide an electrical drive current to the VCSELs by means of the first electrical laser contact 105 and the second electrical laser contact 127. The detector chip 144 further comprises detectors 140, wherein the detectors 140 are aligned with the openings of the first electrical contact 105. The detector chip 144 further comprises an evaluator 323 which is arranged to receive self-mixing interference measurement signals from the detectors 140 to determine distances to, for example, an object to determine a three-dimensional picture of the object. The third VCSEL device 100 further comprises one common optical device 170. The common optical device 120 is integrated on wafer level by means of a transparent material. The transparent material is deposited on top of the VCSELs. The transparent material is further shaped such that laser light 10 emitted by different VCSELs is directed to different directions. The common optical device 120 may further comprise integrated micro lenses (e.g. structured layers of different transparent materials) which are arranged to focus the laser light 10. The optical devices as discussed with respect to FIG. 4 and FIG. 5 may also be combined with the embodiment discussed with respect to FIG. 1.

Figure 6:
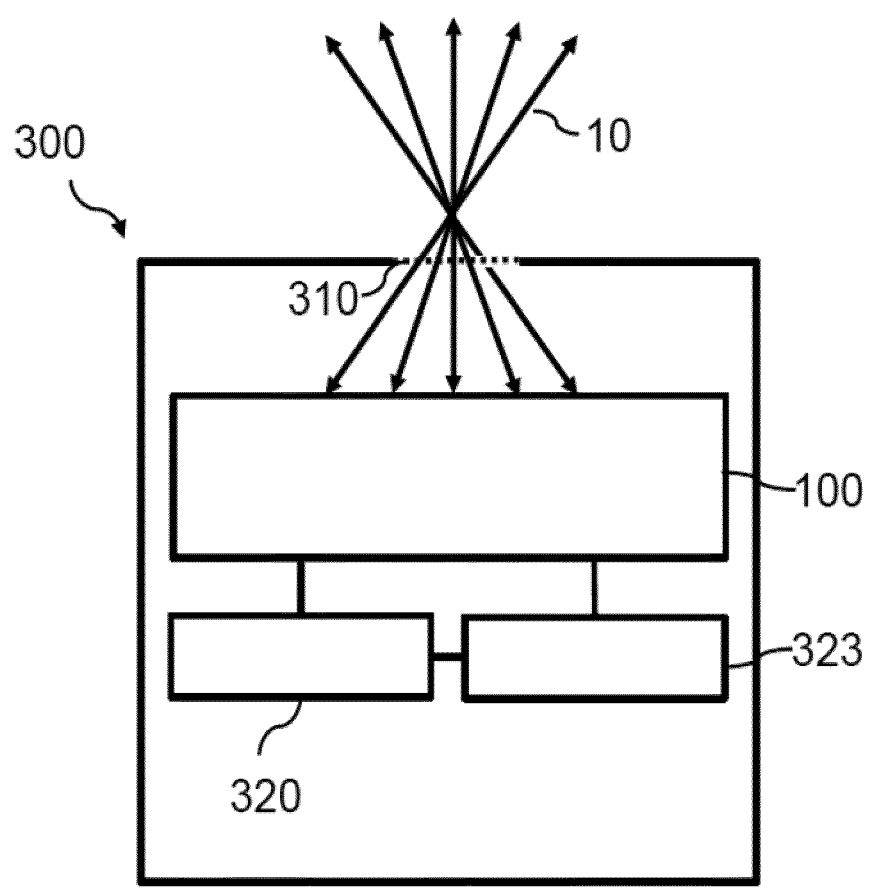
FIG. 6 shows a principal sketch of a self-mixing interference sensor.

FIG. 6 shows a cross-section of self-mixing interference sensor 300 according to a first embodiment. The self-mixing interference sensor 300 is arranged to determine presence, distances and movements of objects by means of self-mixing interference measurements. The optical sensor 300 comprises a VCSEL device 100 as discussed above, a transmission window 310 and a driving circuit 320 for electrically driving the VCSEL device 100. The driving circuit 320 is electrically connected to the VCSEL device 100 to supply electrical power to the VCSEL device 100 in a defined way. The driving circuit 320 comprises a memory device for storing data and instructions to operate the driving circuit 320 and a processing unit for executing data and instructions to operate the driving circuit 320. The self-mixing interference sensor 300 further comprises an evaluator 323. The detectors 140 (e.g. photodiodes) comprised by the VCSEL device 100 are arranged to determine variations in the standing wave pattern within the laser cavity coupled to the respective photodiode. The evaluator 323 comprises at least one memory device like a memory chip and at least one processing device like a micro-processor. The evaluator 323 is adapted to receive electrical signals from the VCSEL device 100 and optionally from the driving circuit 320 to determine distances or movements of one or more objects based on the interference of laser light 10 which is reflected by the respective object and the optical standing wave within the respective laser cavity. The evaluator may optionally be arranged to reconstruct a 3-D picture of a scene which is illuminated by means of the self-mixing interference sensor 300.

Figure 7:
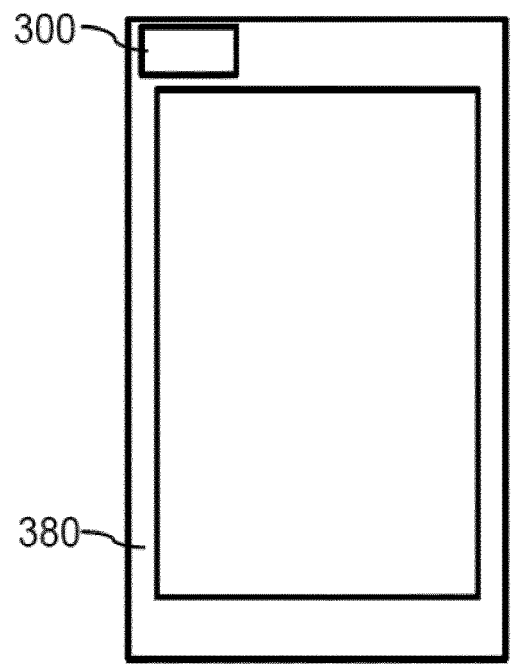
FIG. 7 shows an embodiment of a mobile communication device comprising the self-mixing interference sensor.

FIG. 7 shows a principal sketch of a mobile communication device 380 comprising a self-mixing interference sensor 300. The self-mixing interference sensor 300 can, for example, be used in combination with a software application running on the mobile communication device 380. The software application may use the self-mixing interference sensor 300 for providing a 3-D picture or movie of a scene illuminated by means of the self-mixing interference sensor 300.

Figure 8:
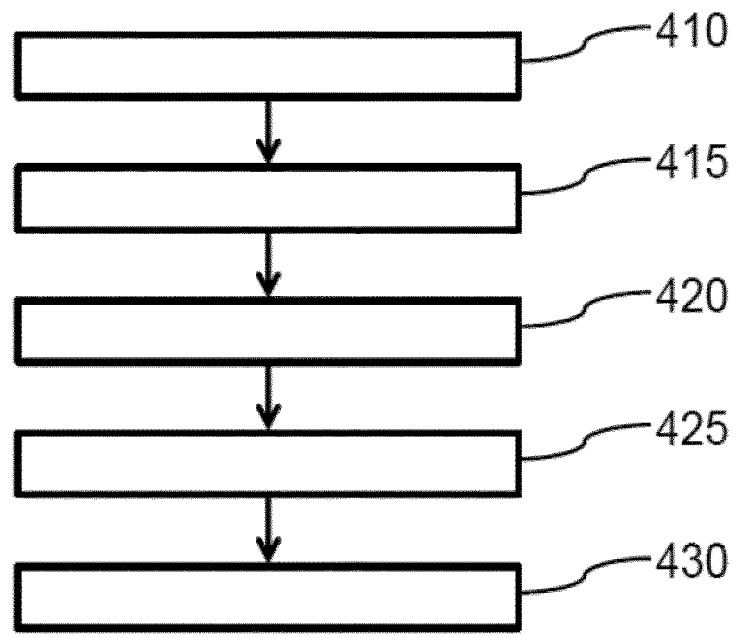
FIG. 8 shows a principal sketch of a process flow of a method of fabricating a VCSEL device.

FIG. 8 shows a principal sketch of a process flow of a method of fabricating a VCSEL device 100 according to the present invention. A substrate 110 is provided in step 410. A VCSEL array comprising a multitude of laser diodes is provided in step 415 on the substrate. Each laser diode comprises an optical resonator. The optical resonator comprises a first distributed Bragg reflector, a second distributed Bragg reflector and an active layer for light emission. The active layer is arranged between the first distributed Bragg reflector 115 and the second distributed Bragg reflector. A first electrical laser contact is provided in step 420. The first electrical laser contact 105 is a common contact for all laser diodes of the VCSEL. An at least one second electrical laser contact is provided in step 425. The first electrical laser contact and the at least one second electrical laser contact are arranged to provide an electrical drive current to electrically pump the optical resonators of the laser diodes. The at least one second electrical laser contact is further arranged to electrically contact at least a subgroup of the multitude of laser diodes 122 of the VCSEL array. In step 430 detectors are provided. Each detector is arranged to generate an electrical self-mixing interference measurement signal associated to the at least one laser diode upon reception of laser light.

The layers of the first DBR 115, the active layer 120, the second DBR 135 and the electrical contacts and any other layer as current injection layers and the like may be deposited by epitaxial methods like MOCVD or MBE.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 laser light
100 VCSEL device
105 first electrical laser contact
108 isolating structure
110 substrate
115 first DBR
120 active layer
122 laser diode
127, 127-1, 127-2 second electrical contact
130 oxidation opening
135 second DBR
135-1 first part of second DBR
135-2 second part of second DBR
140 detector
144 detector chip
148 contact pad
150 first detector electrode
160 solder bump
170 optical device
300 self-mixing interference sensor
310 transmission window
320 driving circuit
323 evaluator
380 mobile communication device
410 step of providing a substrate
415 step of providing a VCSEL array
420 step of providing a first electrical laser contact
425 step of providing a second electrical laser contact
430 step of providing a detector

What is claimed is:

1. A Vertical Cavity Surface Emitting Laser device for a self-mixing interference sensor for recording three-dimensional pictures, the VCSEL device comprising:
a VCSEL array;
a multitude of detectors;
a first electrical laser contact; and
at least one second electrical laser contact,
wherein the VCSEL array comprises a multitude of laser diodes, each laser diode including an optical resonator having a first distributed Bragg reflector, a second distributed Bragg reflector and an active layer for light emission, the active layer being arranged between the first distributed Bragg reflector and the second distributed Bragg reflector, wherein the first electrical laser contact and the at least one second electrical laser contact are arranged to provide an electrical drive current to electrically pump the optical resonators of the laser diodes, wherein the first electrical laser contact is a common contact for all laser diodes of the VCSEL array, wherein the at least one second electrical laser contact is arranged to electrically contact at least a subgroup of the multitude of laser diodes of the VCSEL array, and wherein each respective detector of the multitude of detectors is arranged to correspond to a respective subgroup of the multitude of laser diodes, each respective detector is configured to generate an electrical self-mixing interference measurement signal when the respective subgroup of the multitude of diodes emits laser light and a part of the emitted laser light is reflected back to the optical resonator of the respective subgroup of the multitude of laser diodes and interferes with a standing wave pattern within the optical resonator, and wherein the electrical self-mixing interference measurement signals generated by the multitude of detectors are used for the recording of the three-dimensional pictures.

2. The VCSEL device according to claim 1, wherein the multitude of laser diodes comprises at least 1000 laser diodes.

3. The VCSEL device according to claim 1, wherein the VCSEL device comprises a plurality of second electrical laser contacts, wherein each second electrical laser contact is arranged to electrically drive a corresponding subgroup of laser diodes of the VCSEL array.

4. The VCSEL device according to claim 1, wherein the VCSEL device comprises one second electrical laser contact, wherein the first electrical laser contact and the second electrical laser contact are arranged to provide a common electrical drive current to all laser diodes of the VCSEL array.

5. The VCSEL device according to claim 1, wherein each detector is arranged to receive laser light from one corresponding laser diode.

6. The VCSEL device according to claim 1, wherein the multitude of detectors are integrated in the optical resonators of the multitude of laser diodes.

7. The VCSEL device according to claim 6, wherein each optical resonator comprises one dedicated detector.

8. The VCSEL device according to claim 7, wherein each detector comprises a first detector electrode, and wherein the first detector electrode and at least one additional electrode are arranged to read out the electrical self-mixing interference measurement signal.

9. The VCSEL device according to claim 8, wherein the at least one additional electrode comprises the first electrical laser contact or the at least one second electrical laser contact.

10. The VCSEL device according to claim 9, wherein the at least one additional electrode is the at least one second electrical laser contact, wherein the detector is integrated in the second distributed Bragg reflector, and wherein the VCSEL array is arranged such that the laser light is emitted by the VCSEL device via the first distributed Bragg reflector during operation of the VCSEL device.

11. The VCSEL device according to claim 10, wherein the VCSEL device is arranged as a flip chip device.

12. The VCSEL device according to claim 1, wherein the VCSEL array is mounted on a detector chip, wherein the detector chip comprises the detectors.

13. The VCSEL device according to claim 1, wherein the VCSEL device comprises at least one optical device arranged to redirect the laser light.

14. A self-mixing interference sensor for recording three-dimensional pictures comprising:
a VCSEL device according to claim 1,
a driving circuit; and
an evaluator,
wherein the driving circuit is arranged to electrically drive the laser diodes by the first electrical laser contact and the at least one second electrical laser contact, and
wherein the evaluator is arranged to evaluate the electrical self-mixing interference measurement signals.

15. A method of fabricating a Vertical Cavity Surface Emitting Laser (VCSEL) device for a self-mixing interference sensor for recording three-dimensional pictures, the method comprising:
providing a substrate,
providing a VCSEL array comprising a multitude of laser diodes on the substrate, each laser diode of the multitude of laser diodes including an optical resonator having a first distributed Bragg reflector, a second distributed Bragg reflector and an active layer for light emission, wherein the active layer is arranged between the first distributed Bragg reflector and the second distributed Bragg reflector,
providing a first electrical laser contact, the first electrical laser contact being a common contact for all laser diodes of the VCSEL array,
providing at least one second electrical laser contact, wherein the first electrical laser contact and the at least one second electrical laser contact are arranged to provide an electrical drive current to electrically pump the optical resonators of the laser diodes, and wherein the at least one second electrical laser contact is arranged to electrically contact at least a subgroup of the multitude of laser diodes of the VCSEL array, and
providing a multitude of detectors, wherein each respective detector is arranged to correspond to a respective subgroup of the multitude of laser diodes, each respective detector is configured to generate an electrical self-mixing interference measurement signal when the respective subgroup of the multitude of laser diodes emits laser light and a part of the emitted laser light is reflected back to the optical resonator of the respective subgroup of the multitude of laser diodes and interferes with a standing wave pattern within the optical resonator, and wherein the electrical self-mixing interference measurement signals generated by the multitude of detectors are used for the recording of the three-dimensional pictures.

* * * * *